United States Patent [19]
Watanabe

[11] 4,328,517
[45] May 4, 1982

[54] CHANNEL SELECTION APPARATUS FOR TELEVISION RECEIVER

[75] Inventor: Shutoku Watanabe, Yokohama, Japan

[73] Assignee: Hitachi, Ltd., Japan

[21] Appl. No.: 156,016

[22] Filed: Jun. 3, 1980

[30] Foreign Application Priority Data

Jun. 4, 1979 [JP] Japan .................. 54-68953

[51] Int. Cl.³ .............................. H04N 5/44
[52] U.S. Cl. .............................. 358/191.1; 358/193.1; 455/166
[58] Field of Search ............... 358/191.1, 193.1, 194.1; 455/160, 161, 166, 173, 174, 179, 183, 184, 194

[56] References Cited

U.S. PATENT DOCUMENTS 4,041,535  8/1977  Rzeszewski .................. 455/160
4,236,182  11/1980  Minoura .................. 358/193.1

OTHER PUBLICATIONS

Low-cost Digital Tuning System with Full Function Automatic Search Preset, Matsu-ura et al, Nov. 1978, pp. 545-551, IEEE Trans on Cons. Elec., vol. CE-24 No. 4.

Primary Examiner—Michael A. Masinick
Attorney, Agent, or Firm—Craig and Antonelli

[57] ABSTRACT

A channel selection apparatus of a television receiver having a sequential shift signal input terminal for receiving a sequential shift signal to sequentially shift a selected channel position and an electronic tuning type channel selection IC having a defeat signal output terminal for producing a pulse output when the selected channel position changes and a plurality of channel selection output terminals for producing outputs indicative of the channels to be selected. The channel selection apparatus comprises a synchronizing signal discrimination circuit having a NAND gate and a charge/discharge circuit for detecting a synchronizing signal component appearing in a synchronizing signal separation circuit, a wave shaping circuit for producing a pulse output of a predetermined pulse width when triggered by the output at the defeat signal output terminal, and a NAND gate coupled to the synchronizing signal discriminating circuit, the wave shaping circuit and the sequential shift signal input terminal of the channel selection IC for producing a signal to sequentially shift the selected channel position by applying a signal to the sequential shift signal input terminal when the synchronizing signal discrimination circuit does not detect the synchronizing signal and the wave shaping circuit produces no output, and producing a signal to stop the sequential shift operation when the synchronizing signal discrimination circuit detects the synchronizing signal. This arrangement is particularly useful in selecting a channel which is receiving a broadcasting television station signal when the television receiver is turned on.

7 Claims, 15 Drawing Figures

CHANNEL SELECTION APPARATUS FOR TELEVISION RECEIVER

BACKGROUND OF THE INVENTION

1. Field of the Invention

The present invention relates to a channel selection apparatus of a television receiver having an electronic channel section apparatus in which a broadcasting channel is automatically selected upon switching on the power to the television receiver.

2. Description of the Prior Art

Heretofore, in a television receiver having an electronic channel selection apparatus, (the term "electronic channel selection apparatus" herein used means a system which electronically retains a selected channel and it does not include a system which mechanically retains the selected channel), the channel selection upon switching on the power to the television receiver is carried out by preferentially selecting a preset channel in response to the detection of the rise of a power supply voltage of the television receiver. However, in the system in which the preset channel is exclusively and preferentially selected upon the power-on of the television receiver, the channel selection operation stops at the preset channel even if the preset channel does not receive a television broadcast wave upon the power-on (e.g. when the setting of a potentiometer for presetting a tuning voltage for a tuner has been shifted or a broadcasting station of that channel has stopped broadcasting) unless a viewer selects another channel. As a result, the following disadvantage is encountered.

Normally, when the television receiver is shipped from a manufacturer, a position A is preset to channel #2, a position B is preset to a channel #3 and so on. In many cases, the position A is preset to the preferential channel. However, depending on the area in which the television receiver is used, the channel #2 may not be a serving broadcasting station. In this case, if the position A is selected upon turning on, the television receiver does not display a television image. Accordingly, the viewer must select another channel each time he or she switches on the television receiver, or the potentiometer must be readjusted to preset the preferential channel so that a serving television broadcast for the particular area in which the television receiver is located can be received at the position A.

SUMMARY OF THE INVENTION

It is an object of the present invention to provide a channel selection apparatus which overcomes the disadvantages of the prior art apparatus and which is particularly useful in automatically selecting a broadcasting channel upon the switching on the power to the television receiver.

In order to achieve the above object, in accordance with the present invention, circuit means is provided to determine the presence or absence of a synchronizing signal of a television signal and sequentially shifting the channel until a channel receiving the synchronizing signal is detected. At the first channel which receives the synchronizing signal, the circuit means stops the channel selection operation and retains the selected channel.

This arrangement is particularly useful with regard to initial channel selection when the television receiver is first turned on. In that case, according to the present invention, a channel which receives a television broadcasting wave is automatically selected upon the switching on of power to the television receiver.

DESCRIPTION OF THE PREFERRED EMBODIMENT

Figure 1:
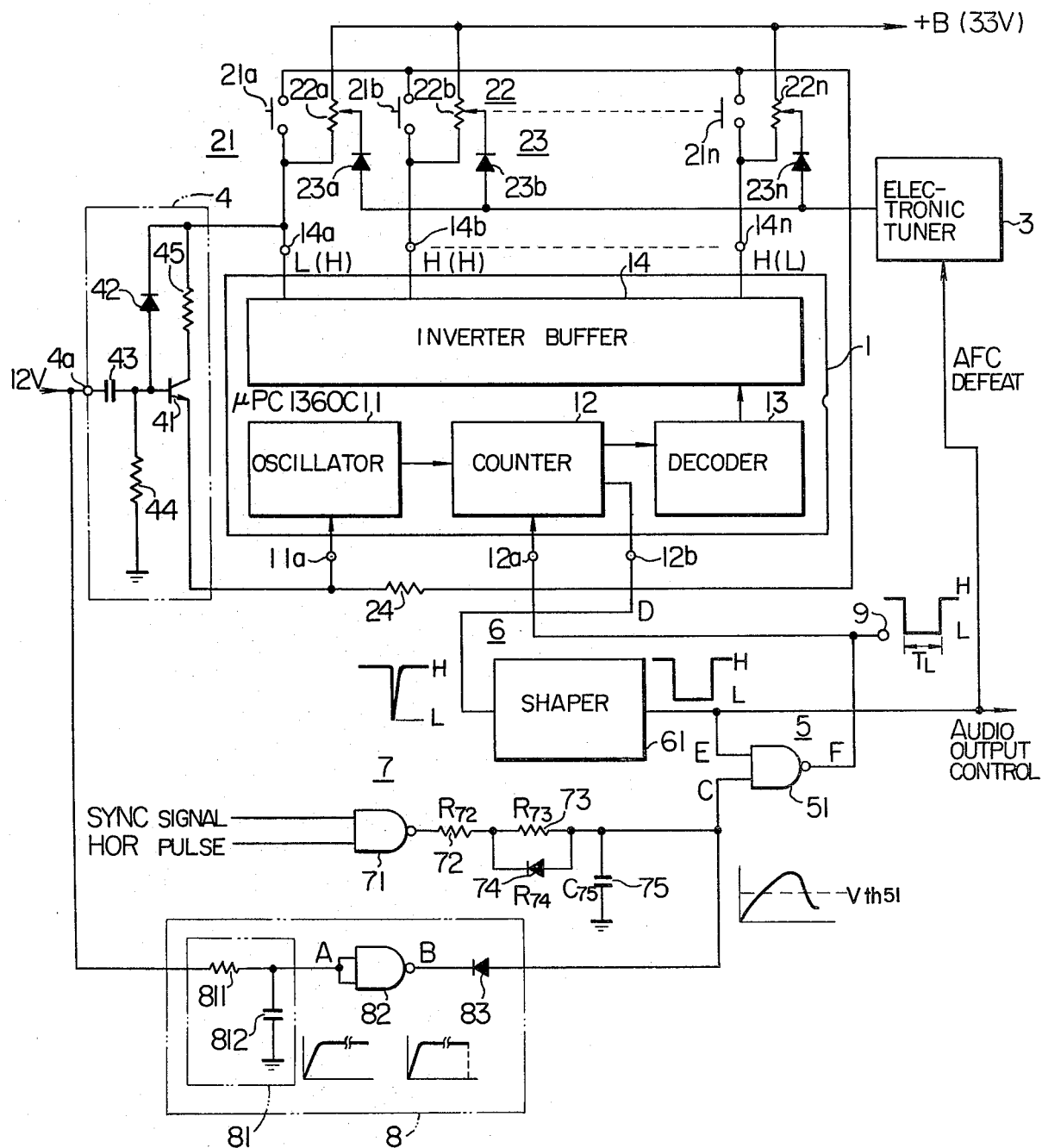
FIG. 1 is a block diagram showing one embodiment of the present invention.

A preferred embodiment of the present invention will now be described in connection with the drawings. FIG. 1 shows a block diagram of one embodiment of the present invention. In FIG. 1, numeral 1 denotes a channel selection IC, e.g. NEC $\mu$PC 1360C, which includes an oscillation circuit 11, a counter 12 for counting up the oscillation output (2.5 KHz) of the oscillation circuit 11, a decoder 13 for decoding the count output of the counter 12, and an inverter buffer 14 responsive to the output from the decoder 13 to render channel selection output terminals 14a, 14b, 14c, . . . 14n to sequentially assume a LOW level in this order. The channel selection IC 1 also includes a channel selection input terminal 11a coupled to the oscillation circuit 11, a sequential shift input terminal 12a coupled to the counter 12 and a defeat signal output terminal 12b coupled to the counter 12 for producing a defeat signal to attenuate or cut off an audio output during the channel selection operation. Such an IC is well known and hence a detail description thereof is not set forth here. Numeral 21 denotes a group of channel selection switches having channel selection switches 21a, 21b, 21c, . . . 21n, the first poles thereof being connected to the channel selection output terminals 14a to 14n, respectively and the second poles being connected to the channel selection input terminal 11a through a resistor 24. Numeral 22 denotes a group of potentiometers comprising potentiometers 22a, 22b, 22c, . . . 22n for presetting tuning voltages for an electronic tuner 3, and numeral 23 denotes a group of diodes comprising diodes 23a, 23b, 23c, . . . 23n for supplying a tuning voltage corresponding to the selected one of the tuning voltages produced at the slidable terminals of the potentiometers 22a to 22n, to the tuner 3. Numeral 4 denotes a preferential channel selection circuit which comprises a transistor 41 and a diode 42. The base of the transistor 41 is connected to a power supply (12 volts) terminal 4a through a capacitor 43 and grounded through a resistor 44. The collector of the transistor 41 is connected to the channel selection output terminal 14a of the channel selection IC 1 through a resistor 45 and the emitter is connected to the channel selection input terminal 11a. The anode of the diode 42 is connected to the base of the transistor 41 and the cathode is connected to the channel selection output terminal 14a.

A conventional channel selection operation of the channel selection apparatus shown and described above will now be explained. When the television receiver is turned on, a voltage at the power supply (+12 V) terminal 4a rises from zero, and a current for charging the capacitor 43 flows through the resistor 44 and a voltage across the resistor rises. When this voltage exceeds a sum of a base-emitter forward voltage of the transistor 41 and a threshold voltage at the channel selection input terminal 11a of the channel selection IC 1, the transistor 41 conducts and the emitter current thereof flows to the channel selection input terminal 11a of the channel selection IC 1. Thus, the oscillation circuit 11, the counter 12, the decoder 13 and the inverter buffer 14 operate in a known manner so that the channel selection output terminals 14a to 14n of the channel selection IC sequentially assume a LOW level. When the channel selection output terminal 14a assumes the LOW level, the diode 42 of the preferential channel selection circuit 4 conducts and the transistor 41 is cut off. In this manner, upon the power-on, the channel is selected to the position corresponding to the channel selection output terminal 14a to accomplish the preferential selection of the preselected channel.

Ordinary channel selection is carried out by turning on a desired one of the channel selection switches 21. For example, when the switch 21n is turned on, a current flows from the power supply line +B (33 volts) to the channel selection input terminal 11a of the channel selection IC 1 through the potentiometer 22n, the switch 21n and the resistor 24 so that the channel selection IC 1 operates in the same manner as described above. When the channel selection output terminal 41n of the channel selection IC 1 corresponding to the switch 21n assumes the LOW level, the current from the power supply line +B flows to the channel selection output terminal 14n through the potentiometer 22n and the current to the channel selection input terminal 11a is blocked. As a result, the oscillator 11 of the channel selection IC 1 stops operation. Thus, the channel is set to the position corresponding to the channel selection output terminal 14n.

When the channels are to be sequentially shifted, a sequential shift is applied to the sequential shift input terminal 12a of the channel selection IC 1 to maintain the potential of the input terminal 12a at the LOW level for a least a predetermined time period so that the LOW level position of the channel selection output terminals 14a to 14n is sequentially shifted one position at a time to shift the selected channel position from 14a to 14b or 14c to 14d, for example.

The channel selection operation described above is known and hence the detail thereof is not explained herein.

If only the conventional equipment is used with the channel selection position being preset when the television receiver is turned on, as described above, the disadvantage explained previously is encountered. Further, even if the channel selection position when the televsion receiver is turned on is not preset, it is still possible for this disadvantage to be encountered.

The present invention intended to overcome the above disadvantage. In the present invention, attention has been paid to the facts that during the channel selection operation by the channel selection switches 21 and the sequential shift input signal, a defeat signal is produced at the defeat signal output terminal 12b of the channel selection IC 1 and that when a television broadcasting wave is not received a synchronizing signal is also not received. Thus, when the channel first selected when the television is turned on does not receive the television broadcasting wave, the channel selection operation sequentially proceeds to a channel which receives a television broadcasting wave and stops at the broadcasting wave receiving channel. A specific embodiment is now explained with reference to FIG. 1, in which numeral 5 denotes a gate circuit which may comprise a NAND gate 51, numeral 6 denotes a circuit which provides the defeat signal appearing at the defeat signal output terminal 12b of the channel selection IC 1 to the gate circuit 5. The circuit 6 comprises a wave shaping circuit 61, an input terminal of which is connected to the defeat signal output terminal 12b while an output terminal of which is connected to one input terminal of the NAND gate 51. The wave shaping circuit 61 may be incorporated in the channel selection IC 1, or the wave shaping circuit 61 may be omitted if the channel selection IC 1 has an ability to provide to the defeat signal output terminal 12b a pulse signal having a pulse width (200 m sec.) corresponding to a time period required for synchronizing the pull time of an AFC circuit. Numeral 7 denotes a synchronizing signal discrimination circuit inserted between a synchronizing signal separation circuit and a deflection circuit (not shown), and the gate circuit 5. The circuit 7 comprises a NAND gate 71 and a charge/discharge circuit including resistors 72 and 73, a diode 74 and a capacitor 75. One input terminal of the NAND gate 71 is connected to a synchronizing signal output terminal of the synchronizing signal separation circuit while the other input terminal of the NAND gate 71 is coupled to a horizontal pulse signal output terminal of the deflection circuit. An output terminal of the NAND gate 71 is grounded through resistors 72 and 73 and a capacitor 75, and also connected to the other input terminal of the NAND gate 51 of the gate circuit 5 through the resistors 72 and 73. A diode 74 is connected in parallel with the resistor 73 as shown. The synchronizing signal discrimination circuit 7 detects both the horizontal pulse signal and the synchronizing signal in order to assure the automatic channel sequential shift operation, is described later, to be carried out even if the selected channel does not receive a television signal or the received signal strength is weak. Principally, the automatic channel selection shift operation can be carried out as long as the circuit 7 can discriminate the presence or absence of the synchronizing signal.

Figure 2:
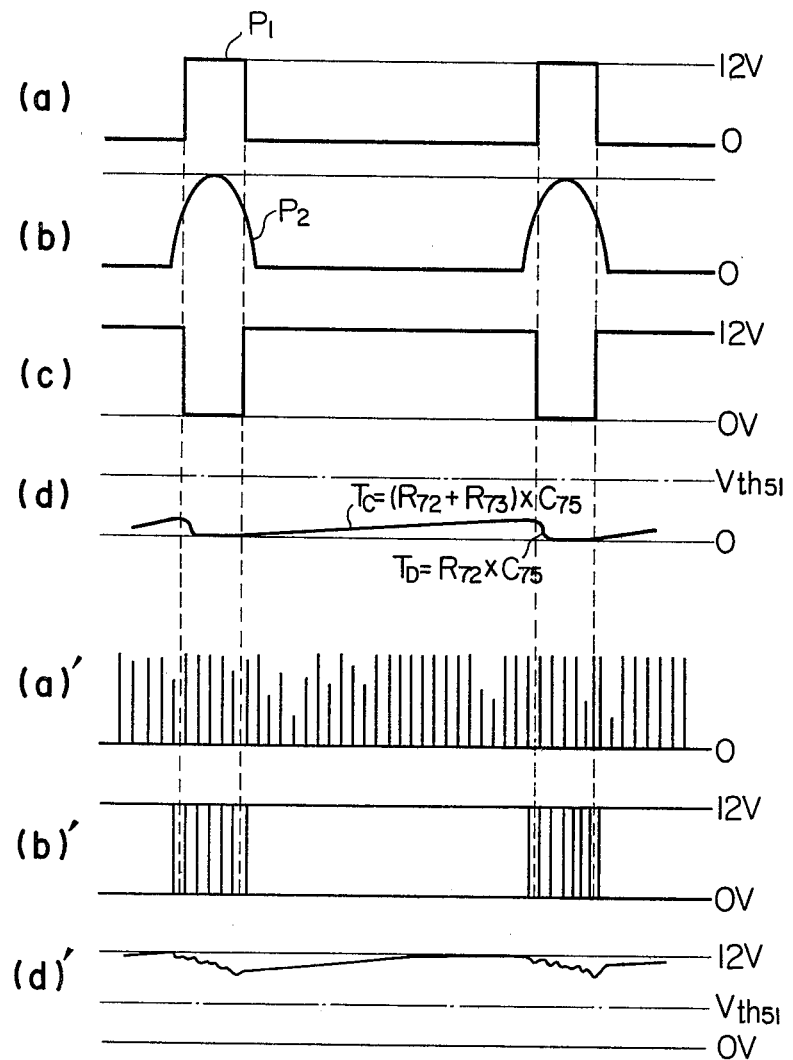
FIG. 2, including a–d, is a timing chart for illustrating the operation of FIG. 1.

Referring to FIG. 2, the operation of the synchronizing signal discrimination circuit 7 is now explained. FIG. 2 shows signal waveforms at the input and output terminals of the synchronizing signal discrimination circuit 7. When the selected channel receives a television signal, a synchronizing signal $P_1$ and a horizontal pulse signal $P_2$ as shown in FIG. 2 (a) and (b) appear at the input terminals of the NAND gate 71 of the synchronizing signal discrimination circuit 7. As the synchronizing signal $P_1$ and the horizontal pulse signal $P_2$ are applied to the input terminals of the NAND gate 71, the output of the NAND gate 71 assumes a LOW level and the voltage at output of the synchronizing signal discrimination circuit 7, that is, the input point C to the other input terminal of the NAND gate 51 of the gate circuit 5 changes as shown in FIG. 2 (d). The voltage at the point C depends on a time constant for charging and discharging the capacitor 75 by the output current from the NAND gate 71.

When the selected channel does not receive the television signal, signals shown in FIG. 2 (a)' and (b)' are applied to the input terminals of the synchronizing signal discrimination circuit 7. Since neither the synchronizing signal nor the horizontal pulse signal is applied, the voltage at the output of the synchronizing signal discrimination circuit 7 changes as shown in FIG. 2 (d)'.

The voltage at the point C depends on the time constant for changing and discharging the capacitor 75 by the output current from the NAND gate 71, as described above. More particularly, it is determined by a charging time constant $T_C = (R_{72} + R_{73}) \cdot C_{75}$ determined by the resistances $R_{72}$ and $R_{73}$ of the resistors 72 and 73 and the capacitance $C_{75}$ of the capacitor 75, and a discharging time constant $T_D \approx R_{72} \cdot C_{75}$ determined by the resistance $R_{72}$ of the resistor 72 and the capacitance $C_{75}$ of the capacitor 75. Accordingly, by selecting the resistances of the resistors 72 and 73 such that $R_{72} < R_{73}$ is met, the voltage at the point C will be below an input threshold voltage $V_{th51}$ of the gate circuit 5 (i.e. at LOW level) when the television signal is received, and above the input threshold voltage $V_{th51}$ (i.e. at HIGH level) when the television signal is not received, as shown in FIG. 2 (d) and (d)'. The duration T of the HIGH level voltage (i.e. higher than the threshold voltage $V_{th51}$) at the point C may be determined by the number of channels to be selected by the channel selection IC 1 and the time required to select any desired channel. For example, if the number of channels to be selected is 15 and the time required for selecting one of the channels is 0.38 m sec., the duration T may be selected to be equal to 0.38 m sec. $\times$ 15 = 5.7 m sec. in order to assure the automatic channel sequential shifting operation, to be described later, to be carried out.

Figure 3:
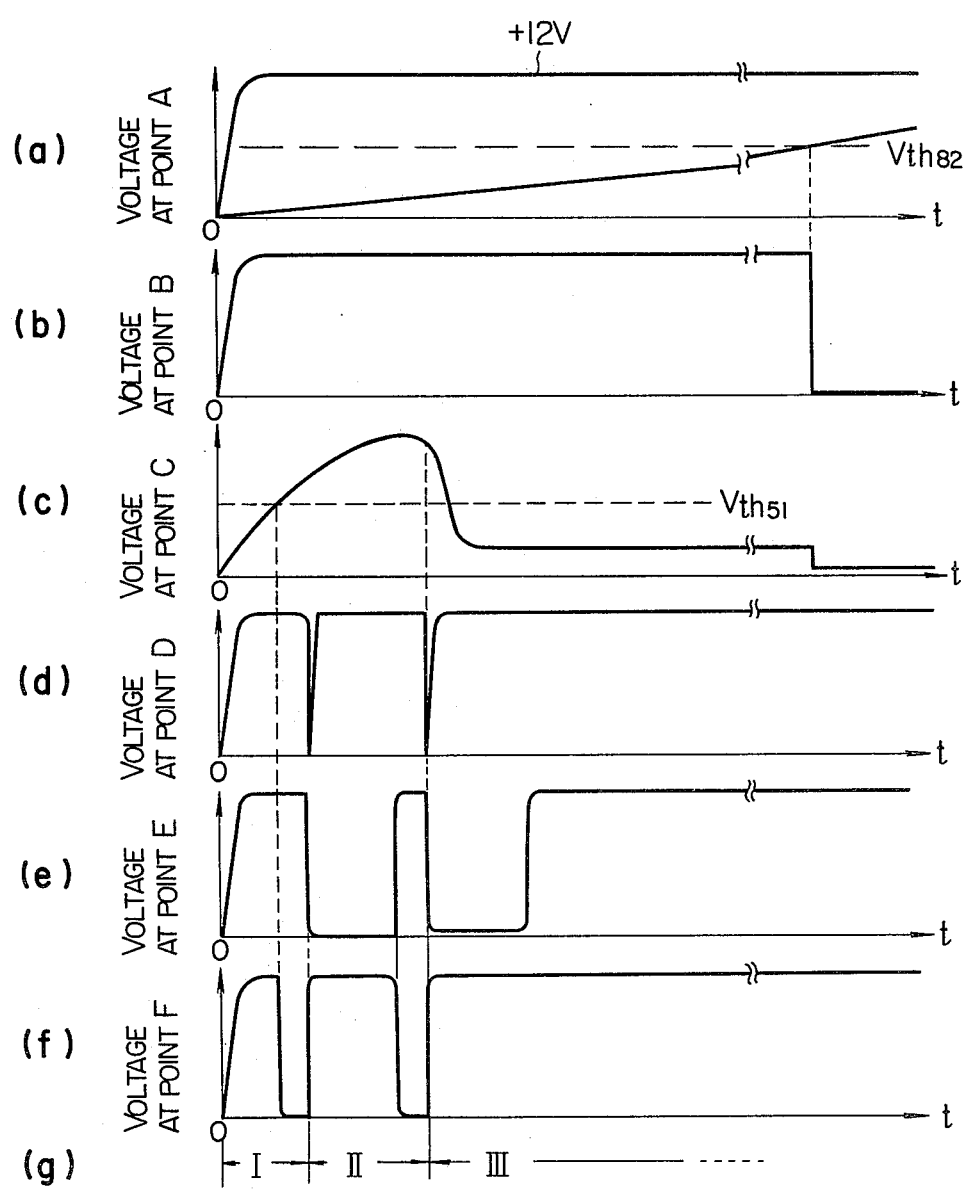
FIG. 3, including a–g, illustrates the operation of a synchronizing signal discriminating circuit.

Referring to FIG. 3, the channel selection operation of the present invention is now explained. FIG. 3 shows a timing chart illustrating voltage levels at major points in FIG. 1.

When the preferential channel selection circuit 4 selects, upon turning on the television receiver, the channel corresponding to the channel selection output terminal 14a of the channel selection IC 1, e.g., channel #2, and the selected channel, that is, the channel #2 does not receive the television signal, the output of the synchronizing signal discrimination circuit 7, that is, the voltage at the point C to the other input of the NAND gate 51 of the gate circuit 5 changes as shown in FIG. 3 (c) and it rises in accordance with the charging time constant $T_C = (R_{72} + R_{73}) \cdot C_{75}$. Since the LOW level defeat signal does not appear at the defeat signal output terminal 12b at this time, the other input point E to the NAND gate 51 is at HIGH level. Accordingly, if the voltage at the input point C to the NAND gate 51 exceeds the threshold voltage $V_{th51}$ of the NAND gate 51, the output point F of the NAND gate 51 assumes LOW level. This LOW level voltage is applied to the sequential shift input terminal 12a of the counter 12 so that the channel selection IC 1 starts the channel sequential shift operation. As a result, the selected channel position shifts from the channel #2 to the adjacent channel #3. At this time, a negative defeat signal as shown in FIG. 3 (d) appears at the defeat signal output terminal 12a. This defeat signal is shaped by the signal shaping circuit 61 and a negative pulse having a fixed pulse width as shown in FIG. 3 (e) appears at the other input point E to the NAND gate 51. Accordingly, the output point F of the NAND gate 51 changes to the HIGH level. If the channel #3 does not receive the television broadcasting wave, the channel is shifted to the next channel, channel #4. More particularly, when the negative pulse output at the point E terminates in the channel #3, the voltage at the point E restores the HIGH level and the voltage at the output point F of the NAND gate 51 reassumes the LOW level. As a result, the channel is shifted one position so that the selected channel changes from the channel #3 to the channel #4.

If the channel #4 receives the television broadcasting wave, the synchronizing signal is applied to the synchronizing signal discrimination circuit 7, which in turn produces the LOW level output, and the voltage at the input point C to the NAND gate 51 falls in accordance with the discharging time constant $T_D \approx R_{72} \cdot C_{75}$ ($\tau_2 < \tau_1$) and finally assumes the LOW level. As a result, irrespective of the voltage level at the other input point E to the NAND gate 51, the voltage at the output point F of the NAND gate 51 changes to the HIGH level and remains at the HIGH level. As a result, the selected channel position is fixed to the channel #4.

It is desirable that the automatic channel sequential shifting operation is completed in a predetermined time period in order to prevent the automatic channel sequential shifting operation from repeating indefinitely when all of the channels do not receive the television broadcasting wave.

A circuit 8 functions to attain the above object. It comprises a delay circuit 81 including a resistor 811 and a capacitor 812, a NAND gate 82 and a diode 83. The NAND gate 82 functions as an inverter. A predetermined time period after the power-on, the output of the synchronizing signal discrimination circuit 7 (at the point C) is normally dropped to the LOW level to keep the output of the NAND gate 51 HIGH level in order to stop the sequential shift operation of the channel selection IC 1. The delay time of the delay circuit 81 may be advantageously set to approximately three seconds. FIG. 3 (a) and (b) shows the voltage levels at the input and output points of the NAND gate 82. By so limiting the operation time period of the sequential shift operation, the above object is achieved.

While the preferred embodiment has been described above in conjunction with the channel selection apparatus having a preferential channel selection circuit, it should be understood that the present invention is equally applicable to the channel selection apparatus without a preferential channel selection circuit.

I claim:

1. A channel selection apparatus for a television receiver comprising:
   an electronic tuner which is preset to be responsive to a plurality of channel selection tuning potentials for tuning the television receiver to different television channels corresponding to the channel selection tuning potentials;
   selecting means for selecting one of said plurality of channel selection tuning potentials to apply said selected potential to said electronic tuner;
   first circuit means for causing said selecting means to sequentially shift said selected potential through the plurality of channel selection tuning potentials;
   defeat signal output means for producing a defeat signal when said selected potential is shifted;
   a synchronizing signal discrimination circuit for discriminating the presence and the absence of a synchronizing signal of a television signal to produce a discrimination output of a first level when said synchronizing signal is absent and a discrimination output of a second level when said synchronizing signal is present;
   a second circuit means responsive to said defeat signal for producing a pulse output signal of a second level having a predetermined duration when said second circuit means receives said defeat signal, and producing an output signal of a first level at the end of said predetermined duration; and a first gate circuit having input terminals thereof connected to receive the discrimination output of said synchronizing signal discrimination circuit and said output signals of said second circuit means and having an output terminal thereof connected to said first circuit means, said first gate circuit being operative to supply a sequential shift signal of a second level to said first circuit means only when the outputs of said synchronizing signal discrimination circuit and said second circuit means are both at said first level to initiate the channel sequential shift operation, and to supply an output signal of a first level in all other cases to stop the channel sequential shift operation, so that said channel sequential shift operation is repeated so long as the output of said synchronizing signal discrimination circuit is at said first level and said sequential shift operation is stopped when the output of said synchronizing signal discrimination circuit assumes said second level.

2. A channel selection apparatus according to claim 1 wherein said synchronizing signal discrimination circuit includes a second gate circuit, coupled to a synchronizing signal separation circuit for producing a HIGH level output when the synchronizing signal is absent and a LOW level output when the synchronizing signal is detected and a charge/discharge circuit coupled to said second gate circuit and said first gate circuit, said charge/discharge circuit charges with a first time constant $T_C$ when the output of said second gate circuit is at HIGH level and discharges with a second time constant $T_D$ when the output of said second gate circuit is at LOW level, said time constants $T_C$ and $T_D$ satisfying a relation of $T_C > T_D$.

3. A channel selection apparatus according to claim 2 wherein said synchronizing signal discrimination circuit further includes a third circuit means for inverting the HIGH level output thereof produced in the absence of the synchronizing signal to the LOW level output a predetermined time period after the television receiver is turned on to stop said channel sequential shift operation of said channel selection apparatus.

4. A channel selection apparatus according to claim 3 wherein said third circuit means comprises a delay circuit connected to a power supply line and the output terminal of said charge/discharge circuit.

5. A channel selection apparatus according to claim 1, further comprising means for activating said selecting means by a signal indicating that the television receiver has been turned on to select an initial channel selection tuning potential corresponding to an initially selected television channel, and wherein said second circuit means produces said output of said first level when said television receiver is turned on so that if said synchronizing signal discrimination circuit detects the absence of a synchronizing signal of a television signal on said initially selected television channel, said first gate will be operative to supply said sequential shift signal of said second level to said first circuit means.

6. A channel selection apparatus according to claim 1, wherein said synchronizing signal discrimination circuit further includes means for discriminating the presence and the absence of a horizontal pulse signal of a television signal, and gate means for only permitting the discrimination output of the synchronizing signal discrimination circuit to have said second level when said horizontal pulse signal is also present.

7. A channel selection apparatus for a televison receiver comprising:

a first circuit for selecting one of a plurality of channel selection tuning potentials for tuning different televison channels corresponding to said channel selection tuning potentials, said first means being activated upon switching on the power for the television receiver to tune a channel corresponding to said selection potential;

a second circuit for causing said first circuit to sequentially shift said selected potential to sequentially select different channels than said channel which was originally selected when the power to said television receiver is switched on;

a defeat signal output circuit for producing a defeat signal when said selected potential is shifted;

a synchronizing signal discrimination circuit for discriminating the presence and the absence of a synchronizing signal of a television signal to produce a discrimination signal when said synchronizing signal is absent in said selected channel;

a third circuit responsive to said defeat signal for producing a pulse signal having a predetermined duration when said defeat signal has been received; and a fourth circuit for producing a sequential shift signal at the trailing edge of said pulse signal when said fourth circuit receives both said discrimination signal and said pulse signal, said fourth circuit further producing a sequential shift signal when said synchronizing signal discrimination circuit discriminates the absence of the synchronizing signal upon switching on the power to said television receiver, whereby the channel is sequentially shifted so long as said synchronizing signal discrimination circuit discriminates the absence of the synchronizing signal and the channel sequential shift is stopped when said synchronizing signal discrimination circuit discriminates the presence of the synchronizing signal.

* * * * *